(12) United States Patent
Lai

(10) Patent No.: US 8,251,550 B2
(45) Date of Patent: Aug. 28, 2012

(54) ILLUMINATION DEVICE WITH ANTI-GLARE FUNCTION

(75) Inventor: Chih-Ming Lai, Miao-Li Hsien (TW)

(73) Assignee: Foxsemicon Integrated Technology, Inc., Chu-Nan, Miao-Li Hsien (TW)

( * ) Notice: Subject to any disclaimer, the term of this patent is extended or adjusted under 35 U.S.C. 154(b) by 262 days.

(21) Appl. No.: 12/701,587

(22) Filed: Feb. 7, 2010

(65) Prior Publication Data

US 2010/0302766 A1 Dec. 2, 2010

(30) Foreign Application Priority Data

May 27, 2009 (CN) .......................... 2009 1 0302680

(51) Int. Cl.
*F21V 3/00* (2006.01)
(52) U.S. Cl. ................ 362/311.02; 362/183; 362/153.1; 257/100
(58) Field of Classification Search .................. 257/100; 362/311.02, 183, 153.1
See application file for complete search history.

(56) References Cited

U.S. PATENT DOCUMENTS

| | | | |
|---|---|---|---|
| 5,782,552 A | * | 7/1998 | Green et al. .................. 362/183 |
| 5,984,570 A | * | 11/1999 | Parashar .......................... 404/14 |
| 6,602,021 B1 | * | 8/2003 | Kim .................................. 404/16 |
| 7,018,131 B2 | * | 3/2006 | Jordan ............................ 404/16 |
| 7,390,109 B2 | | 6/2008 | Li et al. |
| 7,794,103 B2 | * | 9/2010 | Hoover ...................... 362/153.1 |
| 7,887,214 B2 | * | 2/2011 | Chang et al. .................. 362/183 |

FOREIGN PATENT DOCUMENTS

| | | |
|---|---|---|
| CN | 2692485 Y | 4/2005 |
| CN | 1866552 A | 11/2006 |
| CN | 101418924 A | 4/2009 |

* cited by examiner

*Primary Examiner* — Robert May
(74) *Attorney, Agent, or Firm* — Altis Law Group, Inc.

(57) ABSTRACT

An illumination device is adopted for lighting a road and includes a light source, a power storage device, a solar panel, and a light pervious encapsulant. The light source includes an LED and an optical element optically coupled to the LED, light emitted from the LED is redirected to one side of the light source by the optical element at an angle θ in respect to the road surface, wherein, $-30° \leq \theta \leq +30°$. The power storage device is electrically connected to the LED. The solar panel is electrically connected to the power storage device for converting energy of sunlight directly into electricity, and the converted electricity is stored in the power storage device. The light source and the solar panel are packaged in the light pervious encapsulant.

18 Claims, 10 Drawing Sheets

ILLUMINATION DEVICE WITH ANTI-GLARE FUNCTION

BACKGROUND

1. Technical Field

The disclosure generally relates to illumination devices, and particularly, to an illumination device with anti-glare function.

2. Description of Related Art

Light emitting diodes (LEDs) are extensively used as light sources due to their high luminous efficiency, low power consumption, and long lifespan. Although the LEDs can emit bright light to illuminate a dark environment, a glare may occur when bright light from the LEDs directly radiates into the eyes. For example, as shown in FIG. 8, in a typical application of LEDs 101, the LEDs 101 are arranged on a ceiling to provide overhead lighting. Because the LEDs 101 emit light radially, the user with an elevation angle with respect to the LEDs 101 in a range from about 45 degrees to about 85 degrees may see glares from the LEDs 101. The glare causes eye strain and fatigue, which may lead to serious headaches and other discomforts.

Referring to FIG. 9, a road lamp 201 is used for lighting a road to achieve an illumination range around a center of road lamp 201. The illumination range along an X-direction is greater than that along a Y-direction. The X-direction is perpendicular to the Y-direction as shown, and the X-direction expresses the extending direction of the road 11. The distribution curve of the road lamp 201 in the X-direction is shown in FIG. 10; as shown, point A corresponds to 50% of the maximal light intensity of the road lamp 201 in a range from 0° to 90° from a downward vertical line. Point B corresponds to the maximal light intensity of the road lamp 201 in a range from 0° to 90° from the downward vertical line. It can be seen that the angle θ between the light which has 50% maximal light intensity of the light of the road lamp 201 and the downward vertical line is used to characterize radiation range of the road lamp 201. However, the radiation range in the extending direction of the road distributes symmetrically respect to the center of road lamp 201. Specifically, the radiation range is consisted of a first angular range and an opposite second angular range located in the X-direction. The first angular range is directed at an angle θ1 between the light with 50% maximal light intensity of the light and the downward vertical line toward a part of illumination area. The second angular range is directed at an angle θ2 between the light with 50% maximal light intensity of the light and the downward vertical line toward the other part of illumination area. The angles θ1, θ2 are equivalent, usually θ1=θ2=75°, resulting in glare to the drivers on the road.

Therefore, there is a desire to provide an illumination device that overcomes the described limitations.

BRIEF DESCRIPTION OF THE DRAWINGS

Many aspects of the disclosures can be better understood with reference to the following drawings. The components in the drawings are not necessarily drawn to scale, the emphasis instead being placed upon clearly illustrating the principles of the disclosures. Moreover, in the drawings, like reference numerals designate corresponding parts throughout the different views.

DETAILED DESCRIPTION

Figure 1:
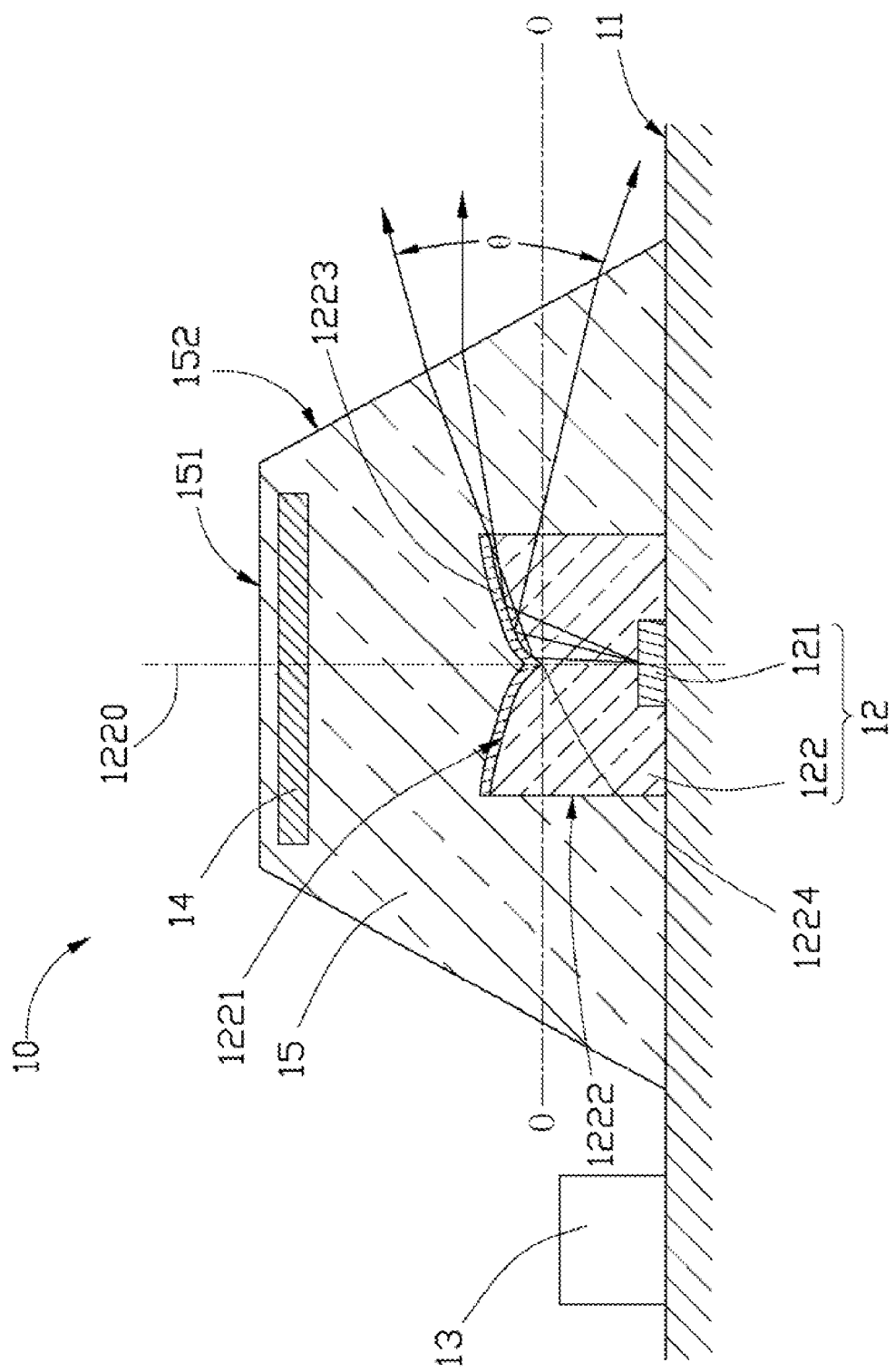
FIG. 1 is cross-sectional view of a first embodiment of an illumination device with a first type optical element.

Referring to in FIG. 1, an illumination device 10 provided in a first exemplary embodiment, which is adopted for lighting a road 11, includes a light source 12, a power storage device 13, a solar panel 14, and a light pervious encapsulant 15.

The light source 12 includes an LED 121 and an optical element 122. The LED 121 refers to a diode that emits visible light, such as white LED, red LED, blue LED, high power LED, etc. It includes incoherent LED dies or encased or encapsulated semiconductor devices marketed as "LEDs", whether of the conventional or super radiant variety, the forward-emitting variety, and the latter of which is often advantageous in illumination applications.

The optical element 122 with a longitudinal package axis 1220 encases and optically couples to the LED 121, and the longitudinal package axis 1220 is perpendicular to an extending direction of the road 11. The optical element 122 includes a funnel-shaped top surface 1221 and a straight vertical sidewall 1222. The LED 121 is located at bottom of the optical element 122 opposite to the top surface 1221, and the longitudinal package axis 1220 extends through a center of the top surface 1221 and a center of the LED 121. The top surface 1221 is a quadric surface, such as a parabola surface. Light emitted from the LED 121 enters the optical element 122 directly and travels to the top surface 1221 where total internal reflection (TIR) causes the light to exit through the sidewall 1222 within a range from a direction at approximately 90 degrees (perpendicular) to the longitudinal package axis 1220. A part of the light directly reflected by the top surface 1221 leaves the sidewall 1222 at 90 degrees to the longitudinal package axis 1220. Light emitted from the LED 121 which transmits towards the sidewall 1222 to exit the optical element 122 at an angle close to perpendicular to the longitudinal package axis 1220. At this situation, almost all of the light indirectly reflected by the top surface 1221 deviates an angle from the direction at 90 degrees to the longitudinal package axis 1220. In operation, the direction of light exits from the optical element 122 can be determined by the configuration of the TIR top surface 1221, such that a dispersal degree which is an angle between the light emitting out from the sidewall 1222 and a horizontal plane O-O which is parallel to and above the road 11 and extends through a bottom tip 1224 of the top surface 1221 of the optical element 122 can be determined. In present embodiment, an angle θ between the light with 50% maximal light intensity of the entire light of the light source 12 with respect to the horizontal plane O-O and thus the road surface can be determined, wherein 0°+θ+30° and −30°−θ0°. In other words, −30°≦θ≦+30°. In addition, the light source 12 may further include a reflecting layer 1223, and the reflecting layer 1223 can be attached to the top surface 1221 of the optical element 122 to improve reflection efficiency of the top surface 1221.

The power storage device 13, such as a battery, is electrically connected to the LED 121, to supply power to LED 121.

The solar panel 14 is electrically connected to the power storage device 13. The solar panel 14 is used to convert the energy of sunlight directly into electricity, and the converted electricity can be stored into the power storage device 13, such that the power storage device 13 can supply power to LED 121 at night to light the road 11.

The light pervious encapsulant 15 is placed on the road 11 and package the light source 12 and the solar panel 14 therein. In present embodiment, the light pervious encapsulant 15 is truncated cone-shaped, which has a top surface 151 and a side surface 152 extending downwardly from an outer edge of the top surface 151. The light source 12 is located at the bottom of the light pervious encapsulant 15 close to the road 11. The solar panel 14 is placed opposite to the light source 12 close to the top surface 151 of the light pervious encapsulant 15, whereby the solar panel 14 can readily receive sunlight directly to optimize light absorption efficiency thereof. The light pervious encapsulant 15 is generally made of a material with great hardness and high light transmittance, such as toughened glass, silica, crystal, sapphire, and so on, to avoid being damage when it is impacted. The index of refraction of the light pervious encapsulant 15 is larger than 1 in application.

As described above, the light emitted from the LED 121 transmits out through the optical element 122 and the light pervious encapsulant 15 to light the road 11. Because of the angle θ has a determined range, namely not larger than +30° and not smaller than −30° in respect to the horizontal plane O-O, and the index of refraction of the light pervious encapsulant 15 is larger than 1, the angle between the light emitted out of the light pervious encapsulant 15 in respect to the plane O-O is still within the determined range that is −30°≦θ≦+30°. Therefore, light with 50% maximal light intensity of the entire light of the light source 12 can emit onto the road 11 or above the road 11 within a limited angle, the glare to the drivers on the road 11 can be avoided.

The light source of the illumination device in the first embodiment can be designed in any useful configuration and is not limited to the configuration in FIG. 1. The following would describe other example of light source to redirect the emitting light to light the road 11. The angle between the emitting light and the road 11 can be determined to be within the range that will not cause glare to a driver on the road 11.

Figure 2:
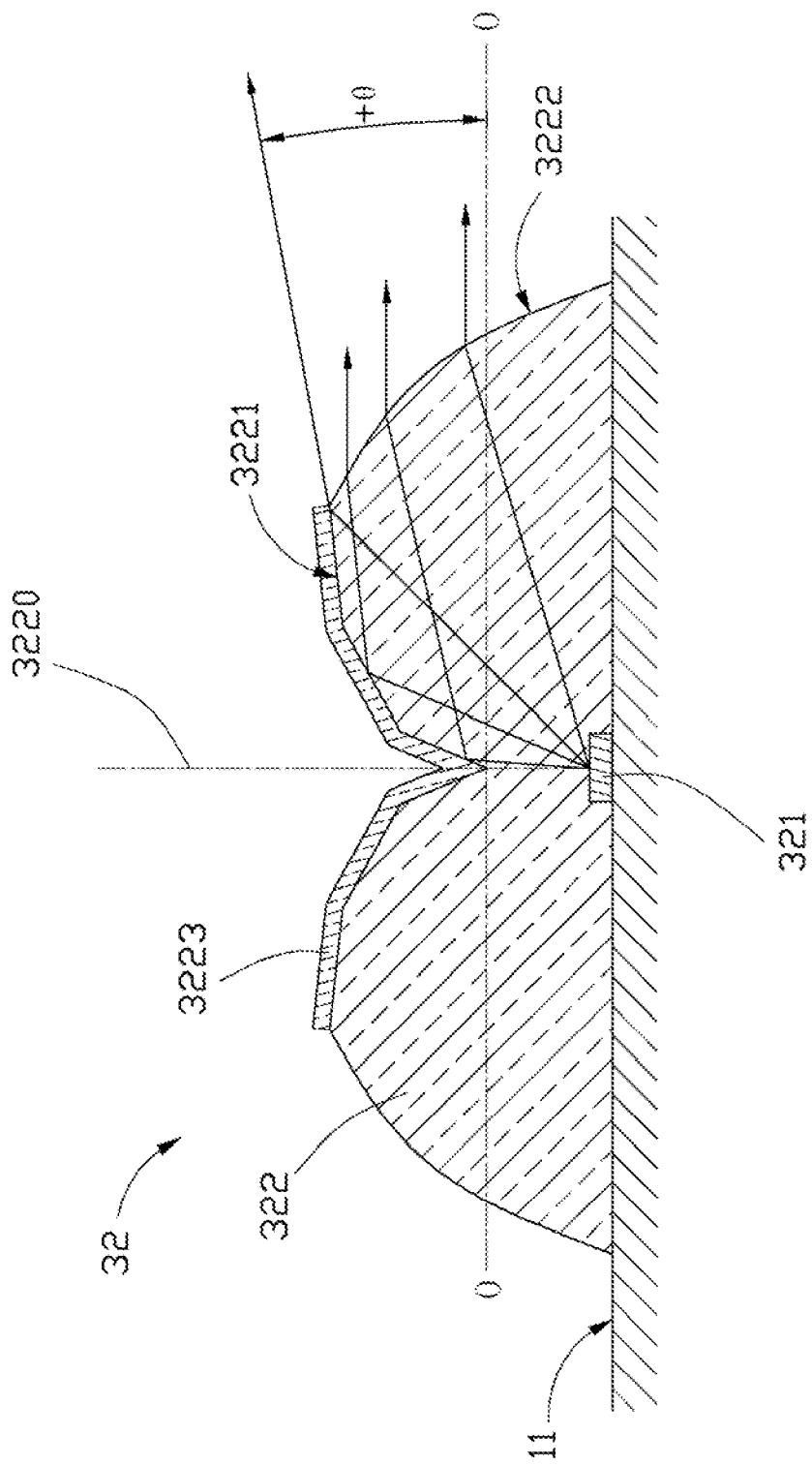
FIG. 2 is cross-sectional view of a second type optical element for the illumination device in FIG. 1.

Referring to FIG. 2, an example for the light source 32 includes an LED 321 and an optical element 322. The optical element 322 with a longitudinal package axis 3220 encases and optically couples to the LED 321, and the longitudinal package axis 3220 is perpendicular to an extending direction of the road 11. The optical element 322 includes a funnel-shaped top surface 3221 and a side surface 3222. The LED 321 is located at a bottom of the optical element 322 opposite to the top surface 3221, and the longitudinal package axis 3220 extends through a center of the top surface 3221 and a center of the LED 321. The top surface 3221 is consisted of several continuous planes with different slopes. In present embodiment, the slopes of the planes are gradually decreased from an inside to an outside of the top surface 3221. The side surface 3222 is a smoothly curved surface. Light emitted from the LED 321 enters the optical element 322 directly and travels to the top surface 3221 where total internal reflection (TIR) causes the light to exit through the side surface 3222 within a range from a direction at approximately 90 degrees to the longitudinal package axis 3220. A part of the light directly reflected by the top surface 3221 leaves the sidewall 3222 at 90 degrees to the longitudinal package axis 3220. Light emitted from the LED 321 which transmits towards the side surface 3222 at an angle causing TIR or a reflection from the side surface 3222 causes the light to also be reflected by the top surface 3221 after reflection by the sidewall 3222 and then exit the optical element 322 from the sidewall 3222 at an angle within the range from the direction at 90 degrees to the longitudinal package axis 3220. At this situation, almost all of the light indirectly reflected by the top surface 3221 deviates an angle from the direction at 90 degrees to the longitudinal package axis 3220. In operation, the direction of light exits from the optical element 322 can be determined by the configuration of the TIR top surface 3221 and the side surface 3222, especially the top surface 3221, such that a dispersal degree which is an angle between the light emitting out from the side surface 3222 and the horizontal plane O-O can be determined. In present embodiment, an angle θ between the light with 50% maximal light intensity of the entire light of the light source 32 and the horizontal plane O-O can be determined, wherein −25°≦θ≦+25° (note: only +θ being shown in FIG. 2 and −θ being omitted). In addition, the light source 32 may further include a reflecting layer 3223, and the reflecting layer 3223 can be attached to the top surface 3221 of the optical element 322 to improve reflection efficiency of the top surface 3221.

Figure 3:
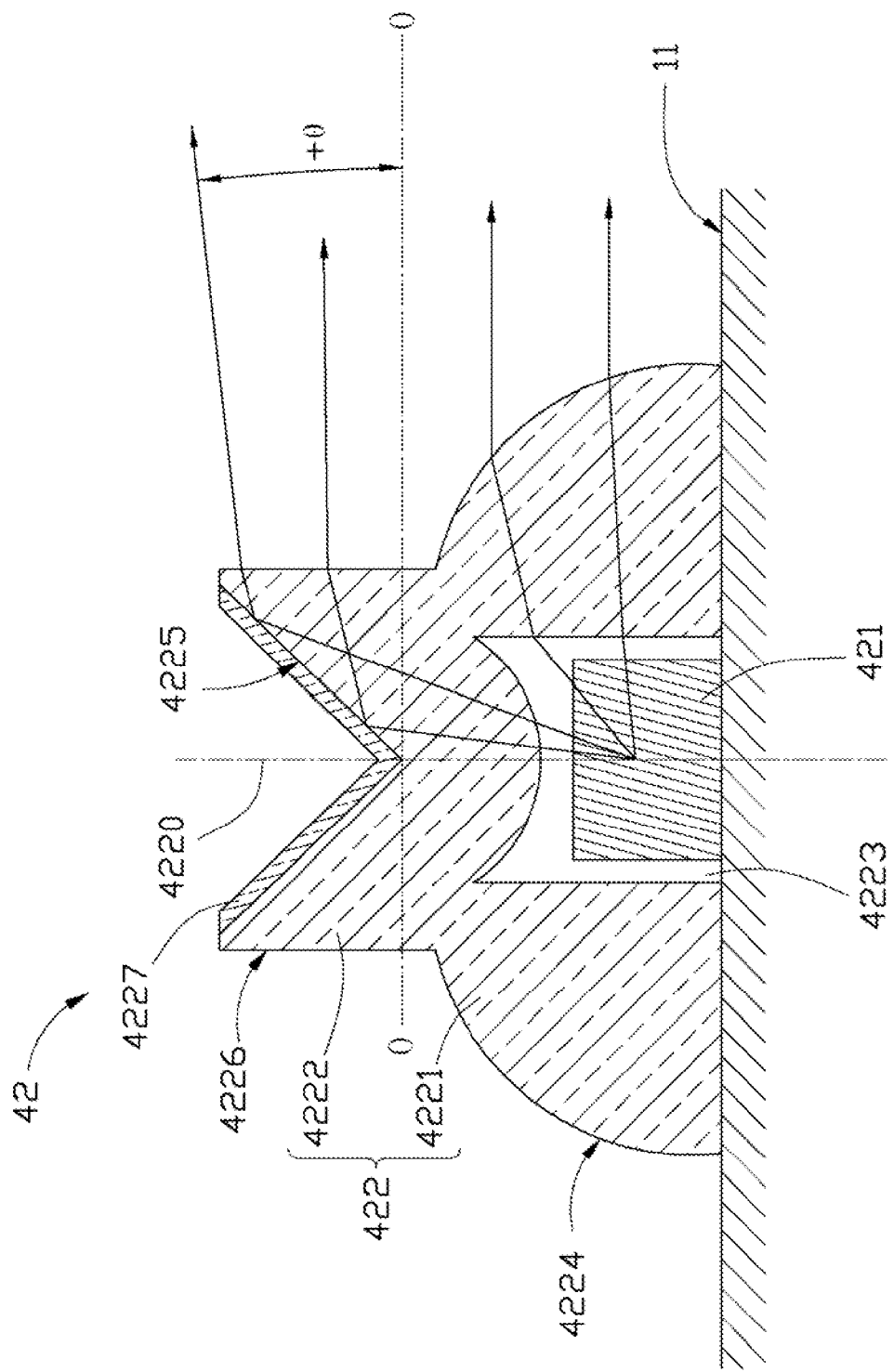
FIG. 3 is cross-sectional view of a third type optical element for the illumination device in FIG. 1.

Referring to FIG. 3, an example for the light source 42 includes an LED 421 and an optical element 422. The optical element 422 with a longitudinal package axis 4220 encases and optically couples to the LED 421, and the longitudinal package axis 4220 is perpendicular to an extending direction of the road 11. The optical element 422 includes a bottom portion 4221 and a top portion 4222. A recess 4223 is defined at a central location of the bottom portion 4221 to receive the LED 421 therein. An external surface 4224 of the bottom portion 4221 is a smoothly curved surface. The top portion 4222 includes a funnel-shaped top surface 4225 and a straight vertical sidewall 4226. Light emitted from the LED 421 enters bottom portion 4221 and the top portion 4222. The light emitted into the bottom portion 4221 would exit through the external surface 4224, while the light emitted into the top portion 4222 would travel to the top surface 4225 where total internal reflection (TIR) causes the light to exit through the sidewall 4226 within a range from a direction at an angle 90 degrees (i.e. perpendicular) to the longitudinal package axis 4220. Light emitted from the LED 421 which transmits out of the optical element 422 at an angle causing TIR or a reflection from the external surface 4224 and the sidewall 4226 is also reflected by the top surface 4225 to exit the optical element 422 at the range from the direction at 90 degrees to the longitudinal package axis 4220. In operation, the direction of light exits from the optical element 422 can be determined by the configuration of the TIR top surface 4221, the sidewall 1222 and the external surface 4224, especially the top surface 1221, an angle θ between the light with 50% maximal light intensity of the entire light of the light source 42 with the extending direction of the road 11 can be determined, wherein −25°≦θ≦25°. In addition, the light source 42 may further include a reflecting layer 4227, and the reflecting layer 4227 can be attached to the top surface 4225 of the top portion 4222 to improve reflection efficiency of the top surface 4225.

Figure 4:
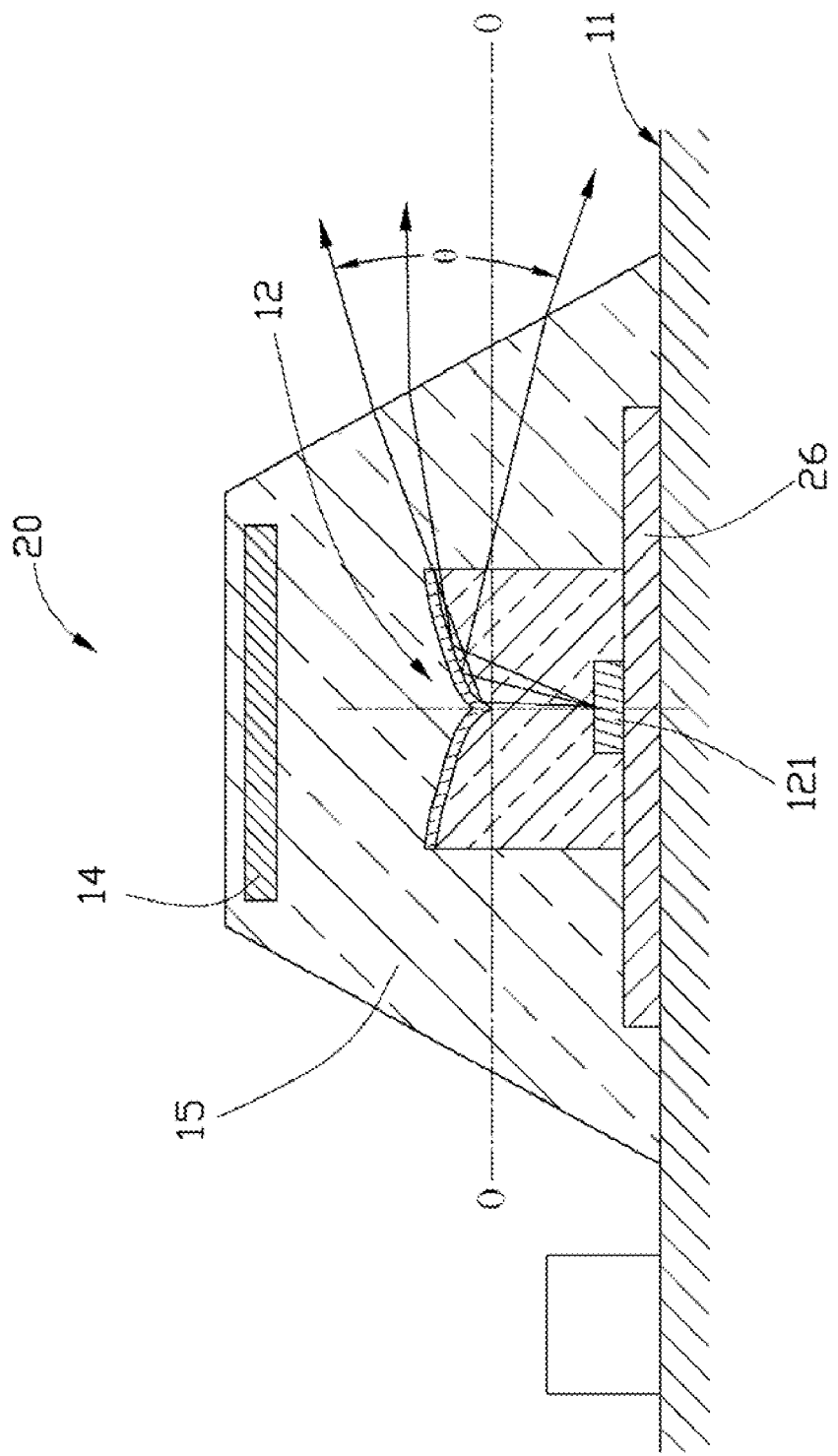
FIG. 4 is cross-sectional view of a second embodiment of an illumination device.

Referring to FIG. 4, an illumination device 20, in accordance with a second embodiment, is provided. The illumination device 20 is similar to that of the first embodiment, except that the illumination device 20 further includes a base 26, the light source 12 is placed on the base 26. The solar panel 14 and the LED 121 of the light source 12 are respectively electrically connected to the base 26. The light source 12, the solar panel 14 and the base 26 all are packaged in the light pervious encapsulant 15.

Figure 5:
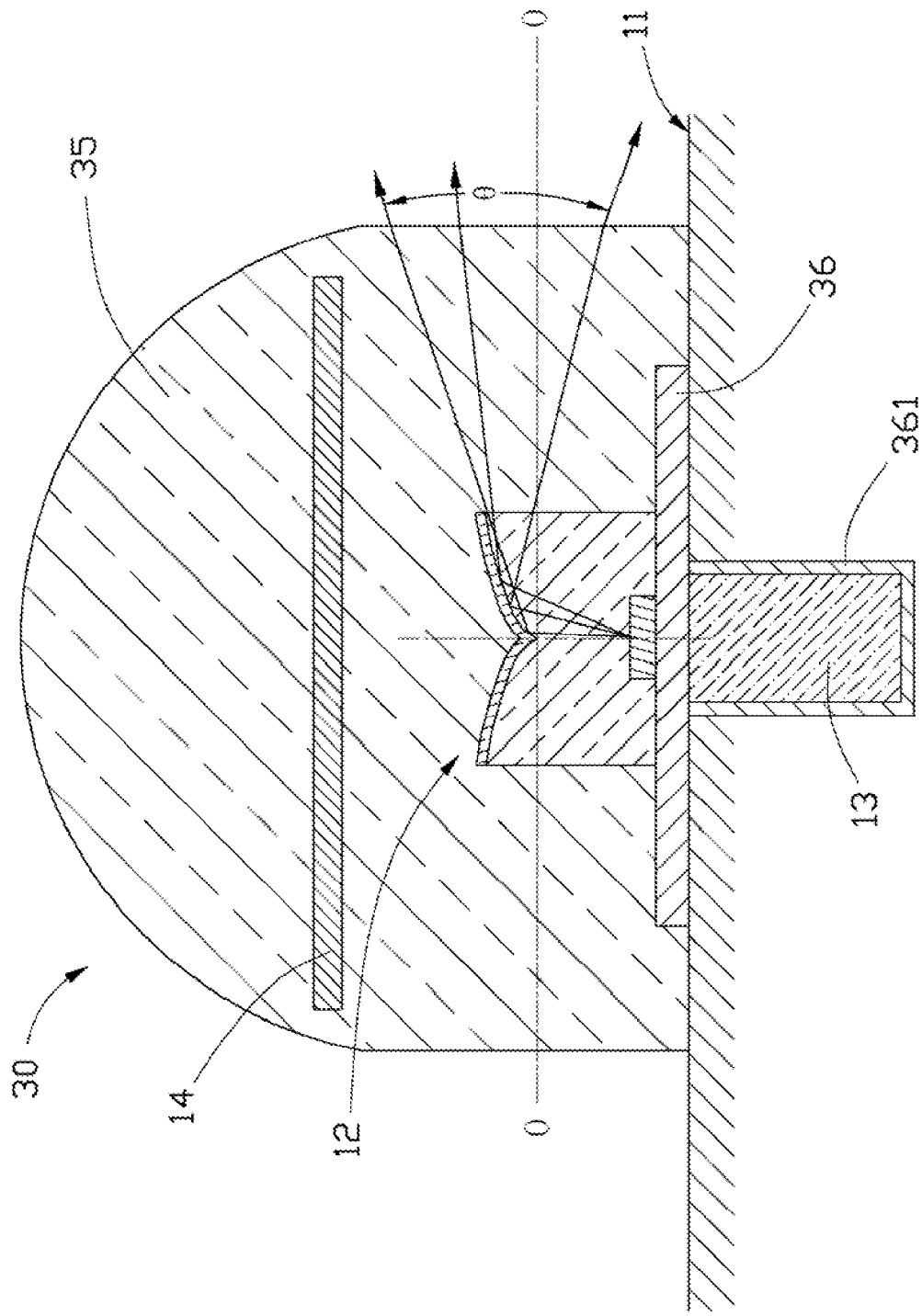
FIG. 5 is cross-sectional view of a third embodiment of an illumination device.

Referring to FIG. 5, an illumination device 30, in accordance with a third embodiment, is provided. The illumination device 30 is similar to that of the second embodiment, except that a base 36 further includes a container 361 configured for receiving the power storage device 13 therein. The container 361 is attached to one side of the base 36 opposite to the light source 12. The container 361 can be inserted into the road 11 to fix the illumination device 30 thereon. A light pervious encapsulant 35 of the illumination device 30 is dome shaped, and the solar panel 14 is packaged in the encapsulant 35 at a position near the top of the light pervious encapsulant 35, which facilitates the solar panel 14 to receive sunlight directly to optimize sunlight absorption efficiency thereof.

Figure 6:
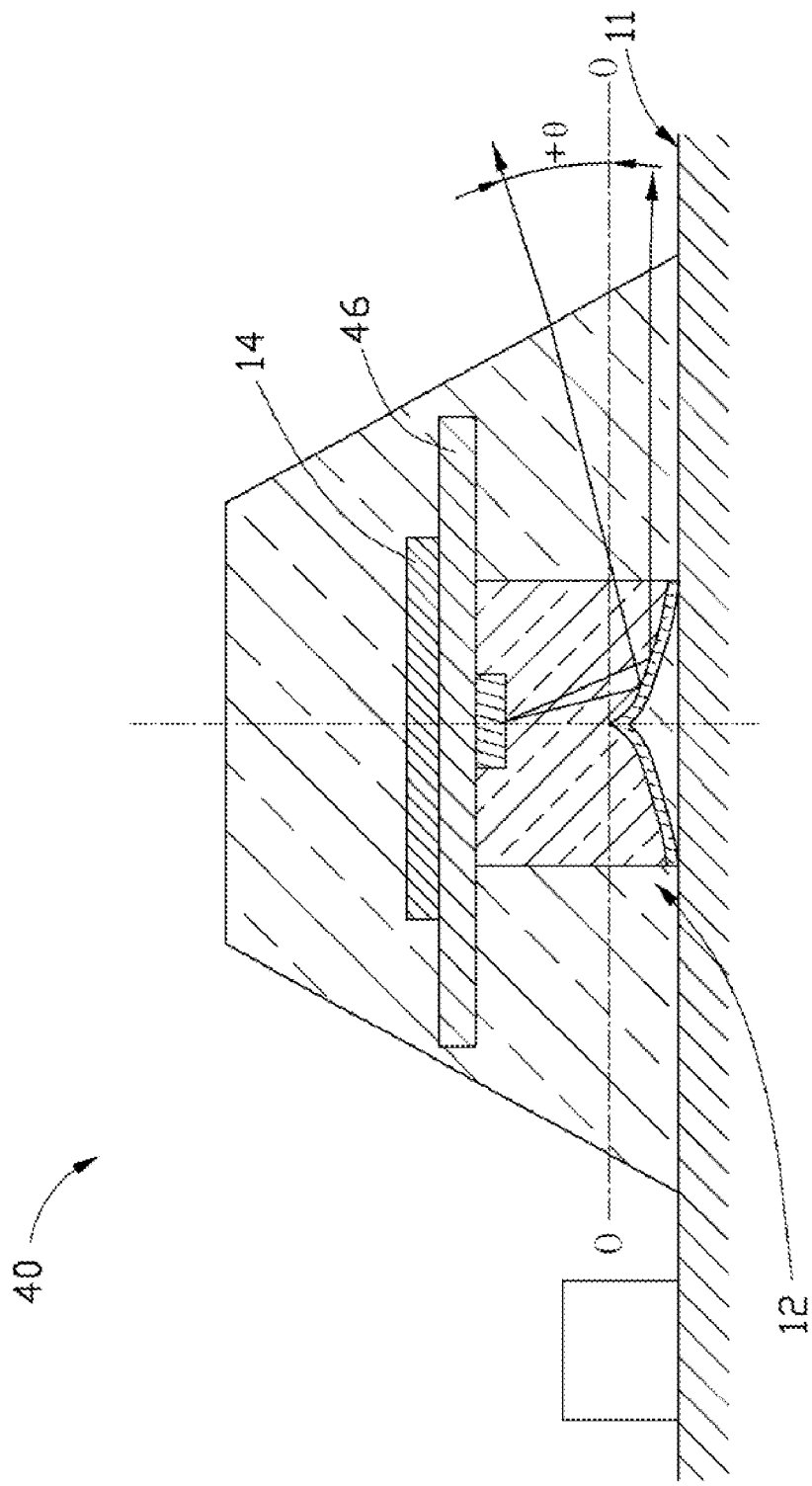
FIG. 6 is cross-sectional view of a fourth embodiment of an illumination device.

Referring to FIG. 6, an illumination device 40, in accordance with a fourth embodiment, is provided. The illumination device 40 is similar to that of the second embodiment, except that the light source 12 and the solar panel 14 are respectively located at two opposite sides of a base 46, and the light source 12 is close to the road 11. The illumination device 40 can have an advantage of space saving, due to sharing the base 46 by the light source 12 and the solar panel 14.

Figure 7:
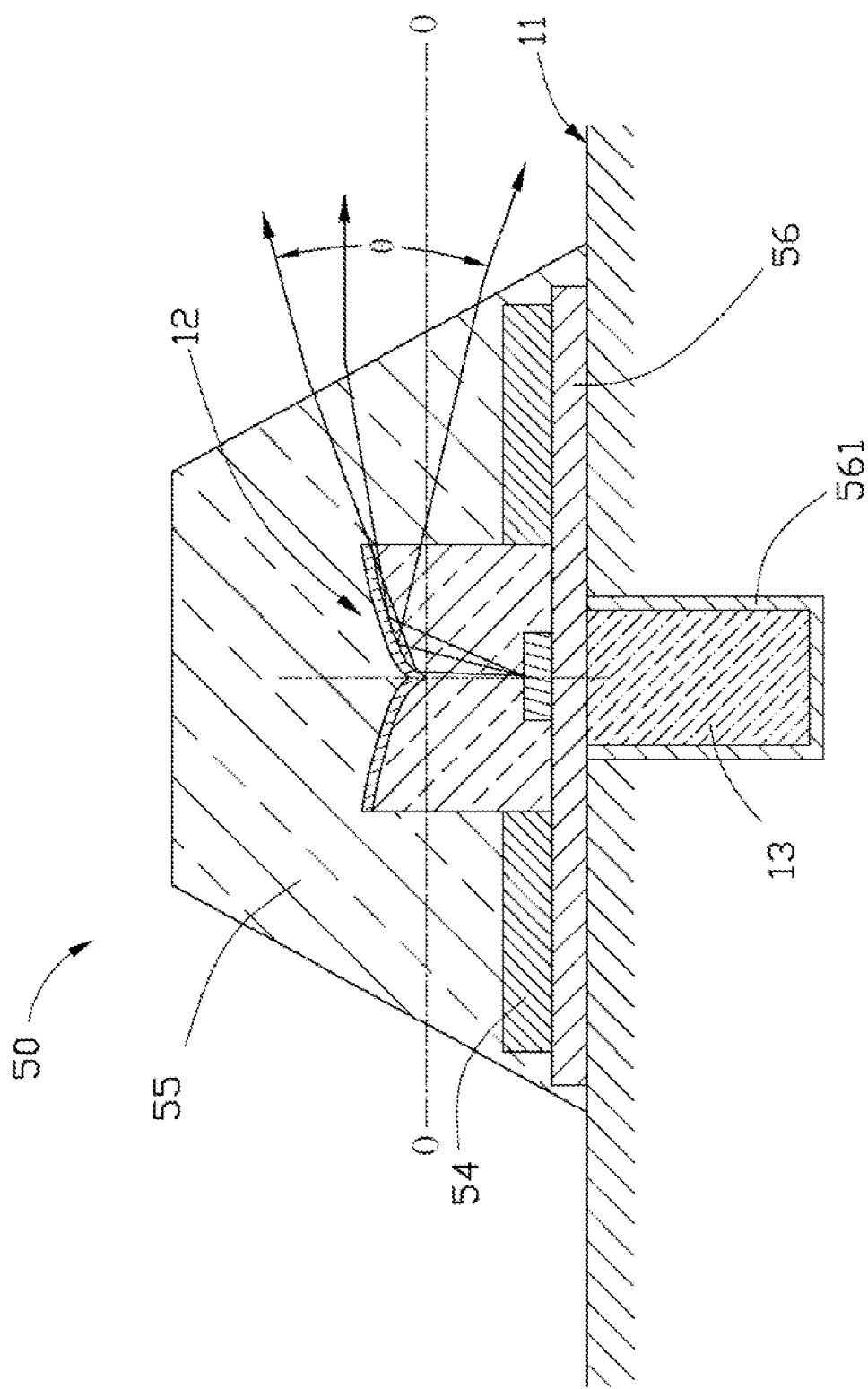
FIG. 7 is cross-sectional view of a fifth embodiment of an illumination device.
Figure 8:
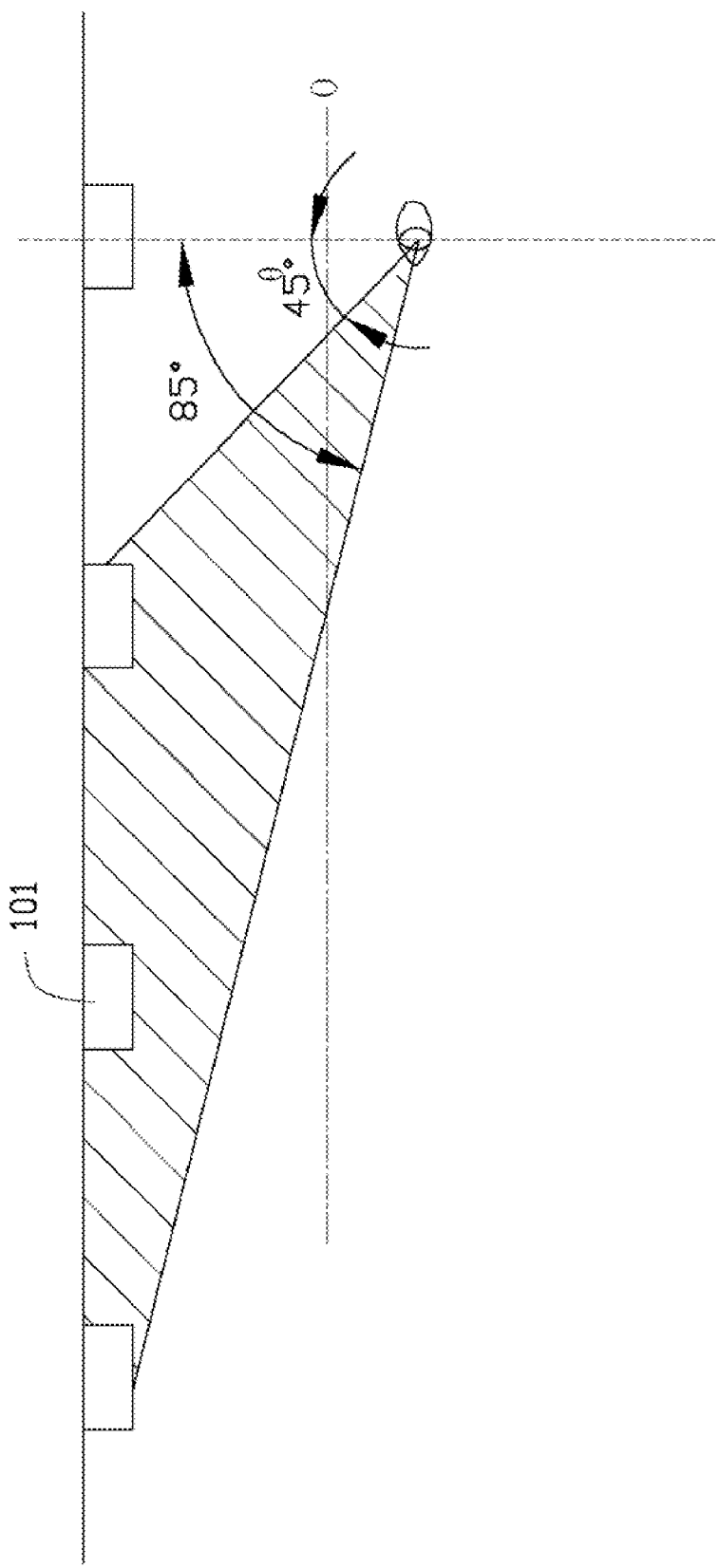
FIG. 8 is a schematic view illustrating occurrence of a typical glare.
Figure 9:
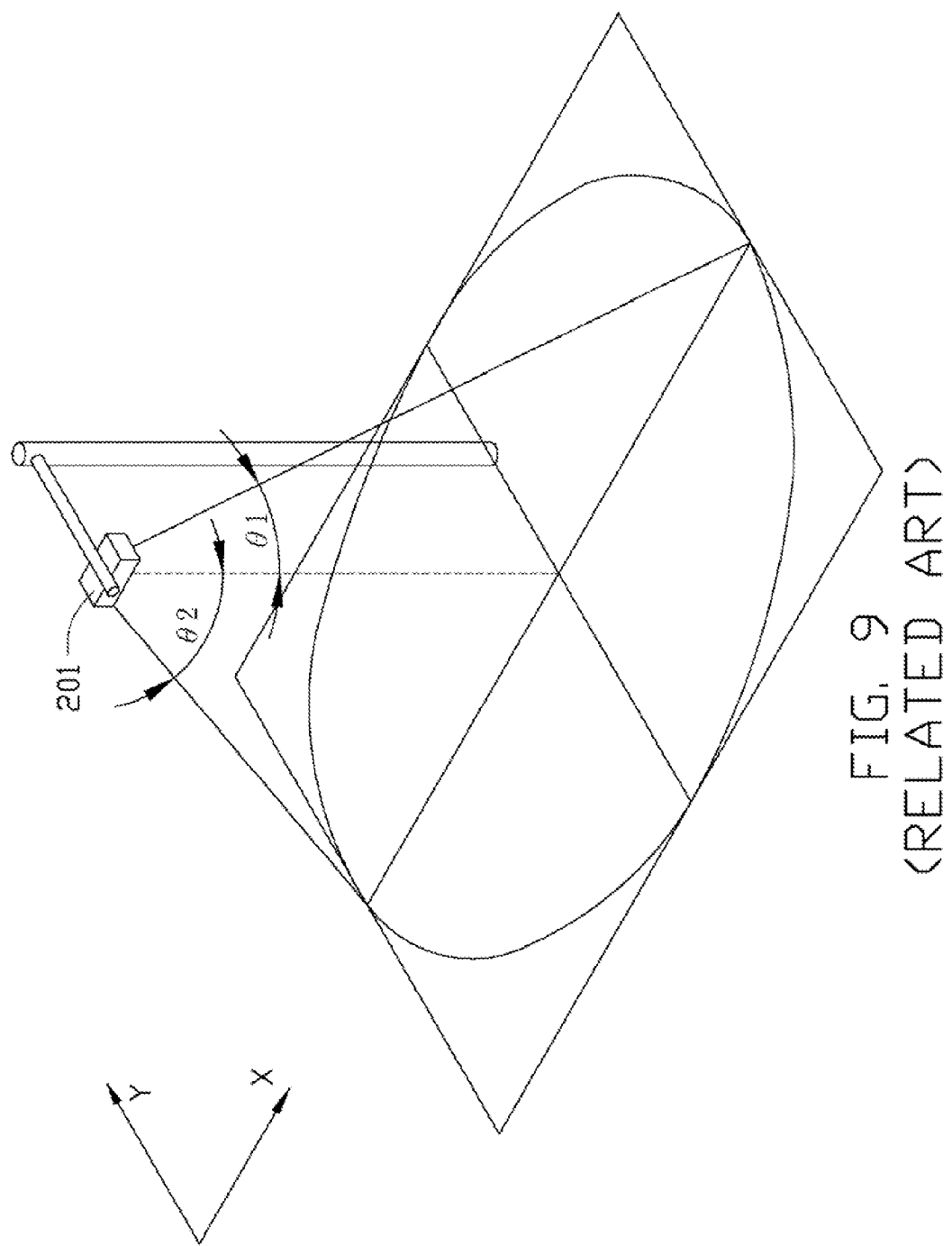
FIG. 9 is a schematic view of a typical road lamp lighting the road to achieve an illumination range.
Figure 10:
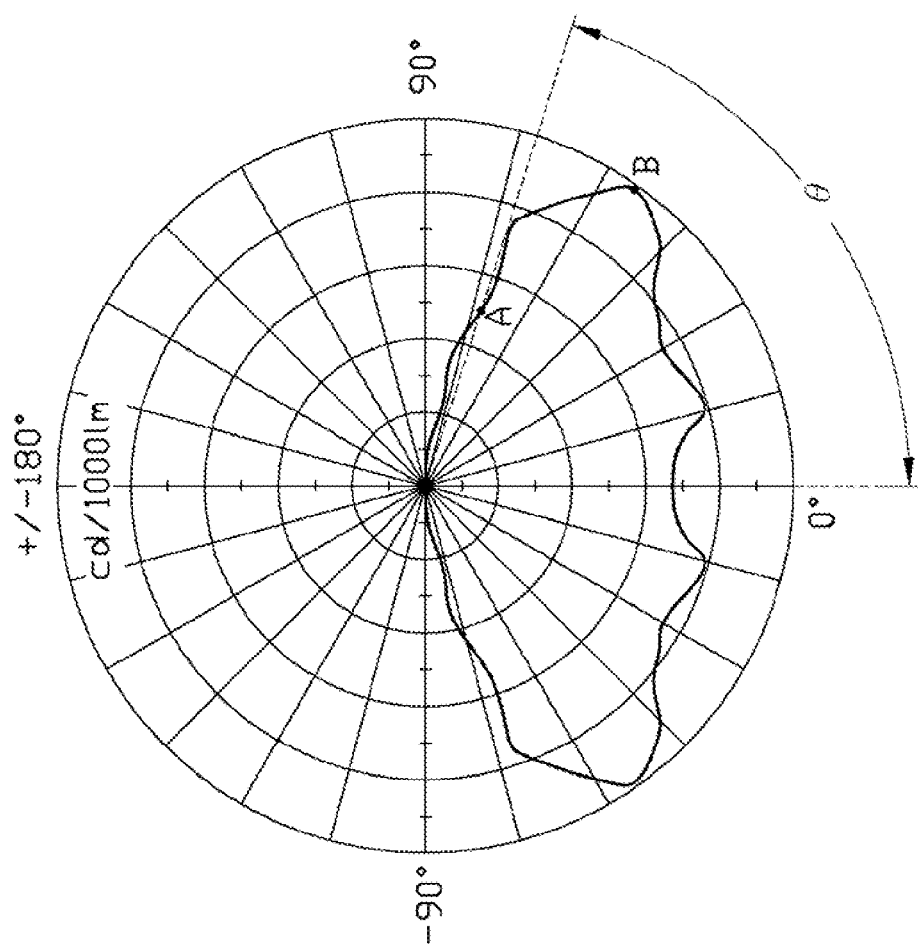
FIG. 10 is a distribution curve of light intensity of the road lamp of FIG. 9 on an X-direction of a road.

Referring to FIG. 7, an illumination device 50, in accordance with a fifth embodiment, is provided. The illumination device 50 is similar to that of the second embodiment, except that a base 56 further includes a container 561 configured for receiving the power storage device 13 therein. The container 561 is attached to one side of the base 56 opposite to the light source 12. The container 561 can be inserted into the road 11 to fix the illumination device 50 thereon. The light source 12 is located at a central location of a light pervious encapsulant 55, while a solar panel 54 and the light source 12 are located at one side of the base 56. The solar panel 54 is arranged at a periphery of the light source 12 to surround it. Therefore, height of the illumination device 50 can be reduced, such that a degree of jolt when a vehicle runs over the illumination device 50 can be abated.

While certain embodiments have been described and exemplified above, various other embodiments will be apparent to those skilled in the art from the foregoing disclosure. The present invention is not limited to the particular embodiments described and exemplified but is capable of considerable variation and modification without departure from the scope of the appended claims.

What is claimed is:

1. A combination of an illumination device and a road, comprising:
    a light source comprising an LED and an optical element optically coupled to the LED, light emitted from the LED being redirected to one side of the light source by the optical element at an angle θ in respect to a surface of the road, wherein, $-30°\leq\theta\leq+30°$;
    a power storage device being electrically connected to the LED;
    a solar panel being electrically connected to the power storage device for converting energy of sunlight directly into electricity, and the converted electricity being stored into the power storage device; and
    a light pervious encapsulant, wherein the light source and the solar panel are packaged in the light pervious encapsulant;
    wherein the optical element comprises a funnel-shaped top surface and a straight vertical sidewall, the top surface is a total internal reflection surface, the LED is located at bottom of the optical element opposite to the top surface.

2. The combination of an illumination device and a road of claim 1, wherein the light pervious encapsulant is truncated cone-shaped, the light pervious encapsulant has a first surface and a side surface extending downwardly from an outer edge of the first surface to the surface of the road, the light source is located close to the road, the solar panel is placed opposite to the light source and near the first surface.

3. The combination of an illumination device and a road of claim 1, wherein the light pervious encapsulant is dome shaped, and the solar panel is arranged away from the road.

4. The combination of an illumination device and a road of claim 1, further comprising a base, the light source is placed on the base, the solar panel and the LED are electrically connected to the base, the light source, the solar panel and the base all are packaged in the light pervious encapsulant.

5. The combination of an illumination device and a road of claim 4, wherein the base further comprises a container configured for receiving the power storage device therein, the container is attached to one side of the base opposite to the light source, and the container is inserted into the road to fix the illumination device thereon.

6. The combination of an illumination device and a road of claim 4, wherein the light source is located at a central location of the light pervious encapsulant, the solar panel and the light source are located at one side of the base, and the solar panel is arranged at periphery of the light source to surround the light source.

7. The combination of an illumination device and a road of claim 1, wherein the light source further comprises a reflecting layer, the straight vertical sidewall surrounds the top surface, and the reflecting layer is attached to the funnel-shaped top surface.

8. A combination of an illumination device and a road, comprising:
    a light source comprising an LED and an optical element optically coupled to the LED, the optical element comprising a total internal reflection top surface and a side surface surrounding the top surface, the LED being located below and facing the total internal reflection top surface, light emitted from the LED being reflected and redirected to one side of the light source by the total internal reflection top surface at an angle θ in respect to a surface of the road, wherein, $-30°\leq\theta\leq 30°$; and
    a light pervious encapsulant, wherein the light source and the solar panel are packaged in the light pervious encapsulant.

9. The combination of an illumination device and a road of claim 8, further comprising:
    a power storage device being electrically connected to the LED; and
    a solar panel being electrically connected to the power storage device for converting energy of sunlight directly into electricity, and the converted electricity being stored into the power storage device.

10. The combination of an illumination device and a road of claim 9, wherein the light pervious encapsulant is truncated cone-shaped, the light pervious encapsulant has a first surface and a side surface surrounding the first surface, the light source is located close to the road, and the solar panel is placed opposite to the light source and close to the first surface.

11. The combination of an illumination device and a road of claim 9, wherein the light pervious encapsulant is dome shaped, and the solar panel is arranged away from the road.

12. The combination of an illumination device and a road of claim 9, further comprising a base, the light source is placed on the base, the solar panel and the LED are electrically connected to the base, the light source, the solar panel and the base all are packaged in the light pervious encapsulant.

13. The combination of an illumination device and a road of claim 12, wherein the base further comprising a container configured for receiving the power storage device therein, the container is attached to one side of the base opposite to the light source, and the container is inserted into the road to fix the illumination device thereon.

14. The combination of an illumination device and a road of claim 12, wherein the light source and the solar panel are respectively located at two opposite sides of the base, and the light source is close to the road.

15. The combination of an illumination device and a road of claim 12, wherein the light source is located at a central location of the light pervious encapsulant, the solar panel and the light source are located at one side of the base, and the solar panel is arranged at periphery of the light source to surround it.

16. The combination of an illumination device and a road of claim 8, wherein the light source further comprises a reflecting layer attached to the total internal reflection top surface.

17. A combination of an illumination device and a road, comprising:
- a light source comprising an LED and an optical element optically coupled to the LED, light emitted from the LED being redirected to one side of the light source by the optical element at an angle θ in respect to a surface of the road, wherein, $-30° \leq \theta \leq +30°$;
- a power storage device being electrically connected to the LED;
- a solar panel being electrically connected to the power storage device for converting energy of sunlight directly into electricity, and the converted electricity being stored into the power storage device; and
- a light pervious encapsulant, wherein the light source and the solar panel are packaged in the light pervious encapsulant;
- wherein the optical element comprises a funnel-shaped top surface and a side surface, the top surface is consisted of several continuous planes with different slopes, the LED is located at bottom of the optical element opposite to the top surface, light emitted from the LED travels to the top surface where total internal reflection causes the light to exit through the side surface.

18. A combination of an illumination device and a road of claim 17, wherein the side surface is a smoothly curved surface.

* * * * *